(12) United States Patent
Purdy

(10) Patent No.: US 7,076,321 B2
(45) Date of Patent: Jul. 11, 2006

(54) METHOD AND SYSTEM FOR DYNAMICALLY ADJUSTING METROLOGY SAMPLING BASED UPON AVAILABLE METROLOGY CAPACITY

(75) Inventor: Matthew A. Purdy, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 50 days.

(21) Appl. No.: 10/958,891

(22) Filed: Oct. 5, 2004

(65) Prior Publication Data

US 2006/0074503 A1  Apr. 6, 2006

(51) Int. Cl.
G06F 19/00 (2006.01)
G05B 21/02 (2006.01)

(52) U.S. Cl. .................................... 700/121; 700/74

(58) Field of Classification Search ............... 700/28, 700/46, 73, 74, 108–111, 117–121; 702/83–85; 438/5, 14–18
See application file for complete search history.

(56) References Cited

U.S. PATENT DOCUMENTS

| | | | |
|---|---|---|---|
| 5,402,367 A | 3/1995 | Sullivan et al. | 364/578 |
| 5,586,039 A | 12/1996 | Hirsch et al. | 364/468.01 |
| 5,620,556 A | 4/1997 | Henck | 438/8 |
| 5,657,252 A | 8/1997 | George | 364/550 |
| 5,661,669 A | 8/1997 | Mozumder et al. | 364/552 |
| 5,770,098 A | 6/1998 | Araki et al. | 216/67 |
| 5,822,218 A | 10/1998 | Moosa et al. | 364/488 |
| 5,896,294 A | 4/1999 | Chow et al. | 364/468.28 |
| 5,982,920 A | 11/1999 | Tobin, Jr. et al. | 382/145 |
| 5,999,003 A | 12/1999 | Steffan et al. | 324/537 |
| 6,002,989 A | 12/1999 | Shiba et al. | 702/84 |
| 6,136,712 A | 10/2000 | Klippert, II et al. | 438/692 |
| 6,166,801 A | 12/2000 | Dishon et al. | 355/27 |
| 6,245,581 B1 | 6/2001 | Bonser et al. | 438/8 |
| 6,248,602 B1 | 6/2001 | Bode et al. | 438/14 |
| 6,263,255 B1 | 7/2001 | Tan et al. | 700/121 |
| 6,281,962 B1 | 8/2001 | Ogata et al. | 355/27 |
| 6,303,395 B1 | 10/2001 | Nulman | 438/14 |
| 6,337,217 B1 | 1/2002 | Hause et al. | 438/7 |
| 6,374,199 B1 | 4/2002 | Sugimoto | 703/2 |
| 6,403,385 B1 | 6/2002 | Venkatkrishnan | 438/14 |
| 6,408,219 B1 | 6/2002 | Lamey, Jr. et al. | 700/110 |
| 6,421,574 B1 | 7/2002 | Steffan et al. | 700/121 |
| 6,442,496 B1 * | 8/2002 | Pasadyn et al. | 702/83 |

(Continued)

FOREIGN PATENT DOCUMENTS

WO    WO 02/23289 A2    3/2002

(Continued)

OTHER PUBLICATIONS

Williams et al., "Optimized Sample Planning for Wafer Defect Inspection," 1999 IEEE.

(Continued)

*Primary Examiner*—Maria N. Von Buhr
(74) *Attorney, Agent, or Firm*—Williams, Morgan & Amerson, P.C.

(57) ABSTRACT

The present invention is generally directed to various methods and systems for dynamically adjusting metrology sampling based upon available metrology capacity. In one illustrative embodiment, the method comprises providing a metrology control unit that is adapted to determine a baseline metrology sampling rate for at least one metrology operation, determining available metrology capacity, and providing the determined available metrology capacity to the metrology control unit wherein the metrology control unit determines a new metrology sampling rate based upon the determined available metrology capacity.

27 Claims, 3 Drawing Sheets

U.S. PATENT DOCUMENTS

| | | | |
|---|---|---|---|
| 6,461,878 B1 | 10/2002 | Lansford | 438/14 |
| 6,469,518 B1* | 10/2002 | Davis et al. | 324/600 |
| 6,477,432 B1* | 11/2002 | Chen et al. | 700/51 |
| 6,526,547 B1 | 2/2003 | Breiner et al. | 716/4 |
| 6,577,972 B1* | 6/2003 | Yanaru et al. | 702/83 |
| 6,650,955 B1* | 11/2003 | Sonderman et al. | 700/108 |
| 6,687,561 B1* | 2/2004 | Pasadyn et al. | 700/110 |
| 6,766,214 B1* | 7/2004 | Wang et al. | 700/121 |
| 6,821,792 B1* | 11/2004 | Sonderman et al. | 438/5 |
| 6,831,555 B1* | 12/2004 | Miller et al. | 340/506 |
| 6,859,746 B1* | 2/2005 | Stirton | 702/83 |
| 6,868,299 B1* | 3/2005 | Chandra et al. | 700/109 |
| 2002/0193899 A1* | 12/2002 | Shanmugasundram et al. | 700/108 |
| 2003/0204348 A1 | 10/2003 | Suzuki et al. | 702/83 |
| 2004/0121495 A1* | 6/2004 | Sonderman et al. | 438/14 |

FOREIGN PATENT DOCUMENTS

| | | |
|---|---|---|
| WO | WO 02/103778 A2 | 12/2002 |
| WO | WO 2004/061938 A1 | 7/2004 |

OTHER PUBLICATIONS

McIntyre et al., "Key Considerations in the Development of Defect Sampling Methodologies," 1996 IEEE.

* cited by examiner

METHOD AND SYSTEM FOR DYNAMICALLY ADJUSTING METROLOGY SAMPLING BASED UPON AVAILABLE METROLOGY CAPACITY

BACKGROUND OF THE INVENTION

1. Field of the Invention

This invention relates generally to an industrial process, and, more particularly, to various methods and systems for dynamically adjusting metrology sampling based upon available metrology capacity.

2. Description of the Related Art

After a complete reading of the present application, those skilled in the relevant art will understand that the present invention has broad application to a variety of industries involving the manufacture of a variety of different types of devices or workpieces. By way of example only, the background of the application will be discussed in the context of various problems encountered in the manufacture of integrated circuit devices. However, the present invention is not to be considered as limited to use only within the semiconductor manufacturing industry.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more quickly and more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a lot of wafers using a variety of process tools, including photolithography steppers, etch tools, deposition tools, polishing tools, thermal anneal process tools, implantation tools, etc. The technologies underlying semiconductor process tools have attracted increased attention over the last several years, resulting in substantial refinements. However, despite the advances made in this area, many of the process tools that are currently commercially available suffer certain deficiencies. In particular, some of such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender non-optimal control of critical processing parameters, such as throughput, accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

One technique for improving the operation of a semiconductor processing line includes using a factory wide control system to automatically control the operation of the various process tools. The manufacturing tools communicate with a manufacturing frame-work or a network of processing modules. Each manufacturing tool is generally connected to an equipment interface. The equipment interface is connected to a machine interface that facilitates communications between the manufacturing tool and the manufacturing frame-work. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices.

During the fabrication process various events may take place that affect the performance of the devices being fabricated. That is, variations in the fabrication process steps may result in variations of the features that comprise the device as well as device performance variations. Factors, such as feature critical dimensions, doping levels, contact resistance, particle contamination, etc., all may potentially affect the end performance of the device. Various tools in the processing line are controlled in accordance with performance models to reduce processing variation. Commonly controlled tools include photolithography steppers, polishing tools, etching tools, and deposition tools. Pre-processing and/or post-processing metrology data is supplied to process controllers for the tools. Operating recipe parameters, such as processing time, are calculated by the process controllers based on the performance model and the metrology information to attempt to achieve post-processing results as close to a target value as possible. Reducing variation in this manner leads to increased throughput, reduced cost, higher device performance, etc., all of which equate with increased profitability.

Target values for the various processes performed are generally based on design values for the devices being fabricated. For example, a particular process layer may have a target thickness. Operating recipes for deposition tools and/or polishing tools may be automatically controlled to reduce variation about the target thickness. In another example, the critical dimensions of a transistor gate electrode may have an associated target value. The operating recipes of photolithography tools and/or etch tools may be automatically controlled to achieve the target critical dimensions.

Typically, a control model is used to generate control actions for changing the operating recipe settings for a process tool being controlled based on feedback or feedforward metrology data collected related to the processing by the process tool. To function effectively, a control model must be provided with metrology data in a timely manner and at a quantity sufficient to maintain its ability to predict the future operation of the process tool it controls.

Within many manufacturing industries great effort is made to insure that processing operations are performed accurately such that the resulting device meets target specifications. This is particularly true within the semiconductor manufacturing industry wherein many metrology tools and sensors are used to acquire a vast amount of metrology data to determine the effectiveness and accuracy of the processing operations performed in a process tool and/or the compliance of the resulting workpiece with product specifications. To that end, a typical semiconductor manufacturing facility may devote a great deal of resources to obtaining such metrology data. Typically, a modern semiconductor manufacturing facility will have many metrology tools or stations where a variety of metrology operations are performed. Illustrative metrology data may include the thickness of a process layer, a critical dimension of a feature formed above a substrate, a planarity of a surface, etc. Some metrology tools are dedicated to performing only one type of metrology operations, e.g., critical dimension measurements, whereas other metrology tools are capable of performing multiple metrology operations. Moreover, a typical semiconductor manufacturing facility may have multiple tools capable of performing the same metrology operation.

In semiconductor manufacturing environments, metrology sampling rates are established for various process operations. The sampling rates may vary depending upon a variety of factors, such as the criticality of the particular process, e.g., gate etch processes, and/or how stable the process operations are in terms of controllability. In semiconductor manufacturing environments, metrology sampling rates are typically set below a level where the aggregate of all of the products selected for sampling would completely utilize all available metrology capacity. This may generally be referred to as baseline sampling rates. The baseline sampling rates are set at less than maximum levels to allow the metrology tools to "catch-up" to accumulated work-in-progress (WIP) after one or more of the metrology tools have been taken out of service for a variety of reasons, e.g., routine maintenance, an unscheduled problem with one of the metrology tools, etc. For example, if one out of four available metrology tools is taken out of service, the work-in-progress (WIP) would slowly accumulate in the metrology queues until the out-of-service metrology tool is returned to service. At that time, all four of the available metrology tools would operate at higher than normal utilization rates until the work-in-progress (WIP) queues are reduced to normal.

One of the problems with the above-described methodology is that it under-utilizes a very valuable resource, i.e., the metrology tools. In general, all other things being equal, as baseline sampling rates are kept higher, more information can be obtained as to how the fabrication facility is operating. The additional metrology information may be used to more quickly identify issues within the fabrication facility that could be degrading yield and/or product performance.

An alternative method of addressing changes in metrology capacity is to maintain sampling rates at very high levels that result in nearly full utilization of all metrology tools under normal production. When one or more metrology tools are taken out of production, the sampling rates may be manually lowered to reduce the amount of work-in-progress (WIP) accumulating in the metrology queues. Under this scheme, when the out-of-service metrology tool(s) is returned to production, the sampling rates are returned to their normally high levels. One problem with this method is that it requires a person to manually reduce the relatively high baseline sampling rates when a metrology tool is taken out of service, and to manually increase the sampling rates back to the relatively high baseline rates when the affected metrology tool is returned to production. This is an inefficient process that requires diligent monitoring of metrology tool capacity by whomever has the authority to adjust the facility's sampling rate plans. If the relatively high baseline sampling rates are not reduced in a timely fashion, work-in-progress (WIP) accumulates in the metrology queues. Moreover, because of the relatively high baseline sampling rates employed in this methodology, when the affected metrology tool is returned to production, there is little excess metrology capacity available to work through the accumulated work-in-progress (WIP). Conversely, if the relatively high baseline sampling rates are not re-established in a timely fashion, production may suffer as the volume of metrology data is reduced, thereby negatively impacting the ability to promptly identify problems within the fabrication facility that may adversely affect production and product yields.

The present invention is directed to overcoming, or at least reducing the effects of, one or more of the problems set forth above.

SUMMARY OF THE INVENTION

The present invention is generally directed to various methods and systems for dynamically adjusting metrology sampling based upon available metrology capacity. In one illustrative embodiment, the method comprises providing a metrology control unit that is adapted to determine a baseline metrology sampling rate for at least one metrology operation, determining available metrology capacity, and providing the determined available metrology capacity to the metrology control unit wherein the metrology control unit determines a new metrology sampling rate based upon the determined available metrology capacity.

In another illustrative embodiment, the method comprises providing a metrology control unit that is adapted to determine a baseline metrology sampling rate for at least one metrology operation, determining available metrology capacity, wherein the step of determining available metrology capacity comprises determining a number of metrology tools that are currently available as compared to a total number of metrology tools that are generally available, wherein all of the metrology tools are assumed to be completely interchangeable, providing the determined available metrology capacity to the metrology control unit, wherein the metrology control unit determines a new metrology sampling rate based upon the determined available metrology capacity, and performing additional metrology operations in accordance with the new metrology sampling rate.

In yet another illustrative embodiment, the method comprises providing a metrology control unit that is adapted to determine a baseline metrology sampling rate for at least one metrology operation, determining available metrology capacity, wherein the step of determining available metrology capacity comprises determining a number of metrology tools that are currently available for performing a specific metrology operation as compared to a total number of metrology tools that are generally available for performing the specific metrology operation, wherein all of the metrology tools are adapted to perform at least the specific metrology operation, providing the determined available metrology capacity to the metrology control unit, wherein the metrology control unit determines a new metrology sampling rate based upon the determined available metrology capacity, and performing additional metrology operations in accordance with the new metrology sampling rate.

In a further illustrative embodiment, the method comprises providing a metrology control unit that is adapted to determine a baseline metrology sampling rate for at least one metrology operation, determining available metrology capacity, wherein the step of determining available metrology capacity comprises determining metrology tools that are available for performing the at least one metrology operation and at least a second metrology operation that is different from the at least one metrology operation, providing the determined available metrology capacity to the metrology control unit, wherein the metrology control unit determines a new metrology sampling rate based upon the determined available metrology capacity, wherein, in determining the new metrology sampling rate, a sampling rate for the second metrology operation is reduced to thereby free up additional metrology capacity for performing the at least one metrology operation, and performing additional metrology operations in accordance with the new metrology sampling rate.

BRIEF DESCRIPTION OF THE DRAWINGS

The invention may be understood by reference to the following description taken in conjunction with the accompanying drawings, in which like reference numerals identify like elements, and in which.

Figure 1:
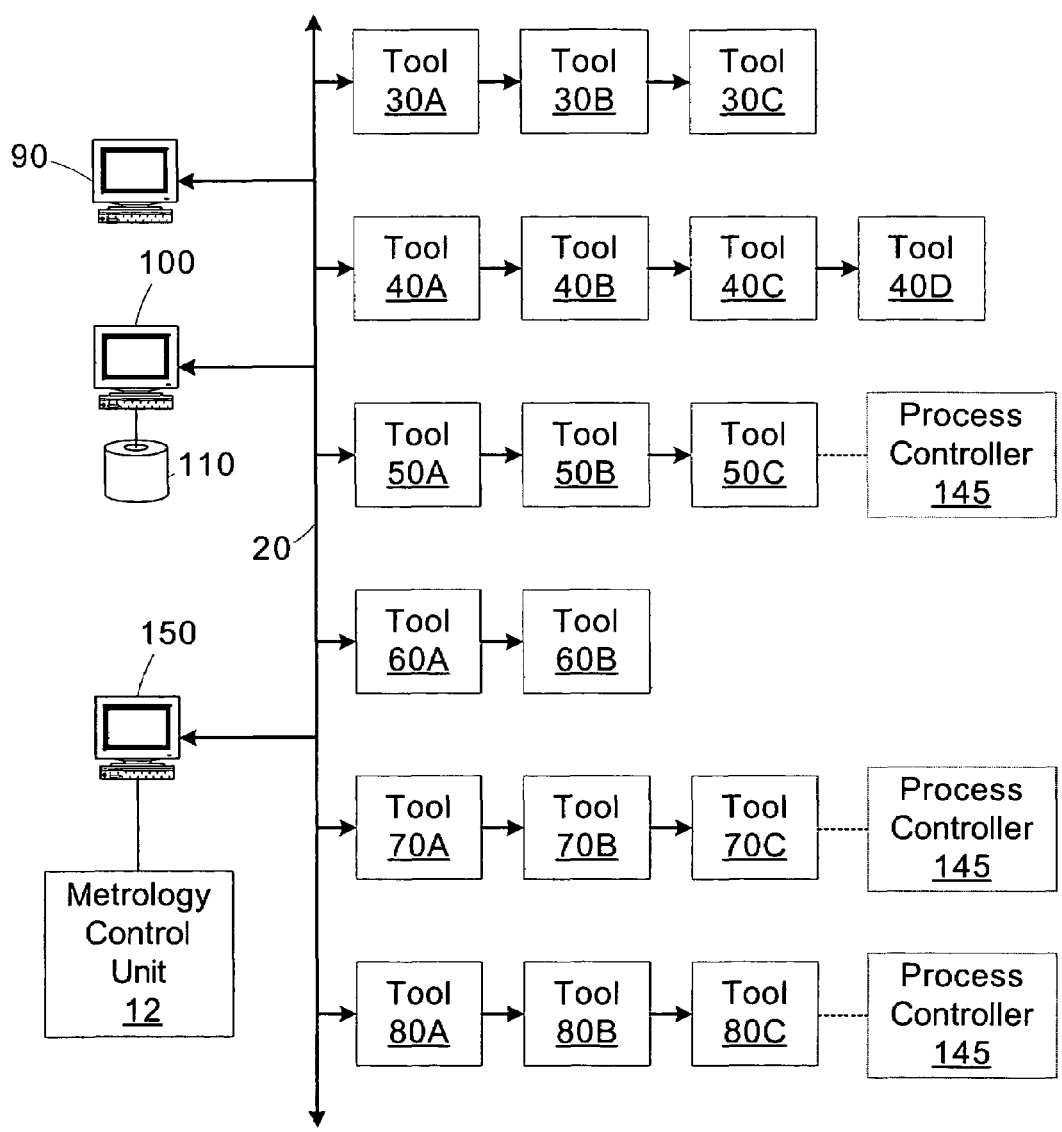
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring to FIG. 1, a simplified block diagram of an illustrative manufacturing system 10 is provided. In the illustrated embodiment, the manufacturing system 10 is adapted to fabricate semiconductor devices. Although the invention is described as it may be implemented in a semiconductor fabrication facility, the invention is not so limited and may be applied to other manufacturing environments. The techniques described herein may be applied to a variety of workpieces or manufactured items. For example, the present invention may be employed in connection with the manufacture of a variety of integrated circuit devices, including, but not limited to, microprocessors, memory devices, digital signal processors, application specific integrated circuits (ASICs), or other devices. The techniques may also be applied to workpieces or manufactured items other than integrated circuit devices.

A network 20 interconnects various components of the manufacturing system 10, allowing them to exchange information. The illustrative manufacturing system 10 includes a plurality of tools 30–80. Each of the tools 30–80 may be coupled to a computer (not shown) for interfacing with the network 20. The tools 30–80 are grouped into sets of like tools, as denoted by lettered suffixes. For example, the set of tools 30A–30C represent tools of a certain type, such as a chemical mechanical planarization tool. A particular wafer or lot of wafers progresses through the tools 30–80 as it is being manufactured, with each tool 30–80 performing a specific function in the process flow. Exemplary processing tools for a semiconductor device fabrication environment include metrology tools, photolithography steppers, etch tools, deposition tools, polishing tools, rapid thermal anneal tools, implantation tools, etc. The tools 30–80 are illustrated in a rank and file grouping for illustrative purposes only. In an actual manufacturing facility, the tools 30–80 may be arranged in any physical order or grouping. Additionally, the connections between the tools in a particular grouping are meant to represent connections to the network 20, rather than interconnections between the tools 30–80.

A manufacturing execution system (MES) server or controller 90 directs high level operation of the manufacturing system 10. The MES server 90 may monitor the status of the various entities in the manufacturing system 10 (i.e., lots, tools 30–80) and control the flow of articles of manufacture (e.g., lots of semiconductor wafers) through the process flow. A database server 100 is provided for storing data related to the status of the various entities and articles of manufacture in the process flow. The database server 100 may store information in one or more data stores 110. The data may include pre-process and post-process metrology data, tool states, lot priorities, operating recipes, etc. The controller 90 may also provide operating recipes to one or more of the tools depicted in FIG. 1 or command that various operating recipes be performed in one or more of the tools. Of course, the controller 90 need not perform all of these functions. Moreover, the functions described for the controller 90 may be performed by one or more computers spread throughout the system 10.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The manufacturing system 10 also includes a metrology control unit 12 executing on an illustrative workstation 150. The metrology control unit 12 may be used to control various metrology tools employed in connection with manufacturing operations performed in the manufacturing system 10. The metrology control unit 12 may communicate with the controller 90 and/or with one or more process controllers 145 associated with the individual tools 30–80 for purposes to be described later herein. The particular control models used by the process controllers 145 depend on the type of tool 30–80 being controlled. The control models may be developed empirically using commonly known linear or non-linear techniques. The control models may be relatively simple equation-based models (e.g., linear, exponential, weighted average, etc.) or a more complex model, such as a neural network model, principal component analysis (PCA) model, partial least squares projection to latent structures (PLS) model. The specific implementation of the control models may vary depending on the modeling techniques selected and the process being controlled. The selection and development of the particular control models would be within the ability of one of ordinary skill in the art, and accordingly, the control models are not described in greater detail herein for clarity and to avoid obscuring the instant invention.

An exemplary information exchange and process control framework suitable for use in the manufacturing system 10 is an Advanced Process Control (APC) framework, such as may be implemented using the Catalyst system formerly offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI, which is headquartered in Mountain View, Calif.

The processing and data storage functions are distributed amongst the different computers or workstations in FIG. 1 to provide general independence and central information storage. Of course, different numbers of computers and different arrangements may be used without departing from the spirit and scope of the instant invention.

Figure 2:
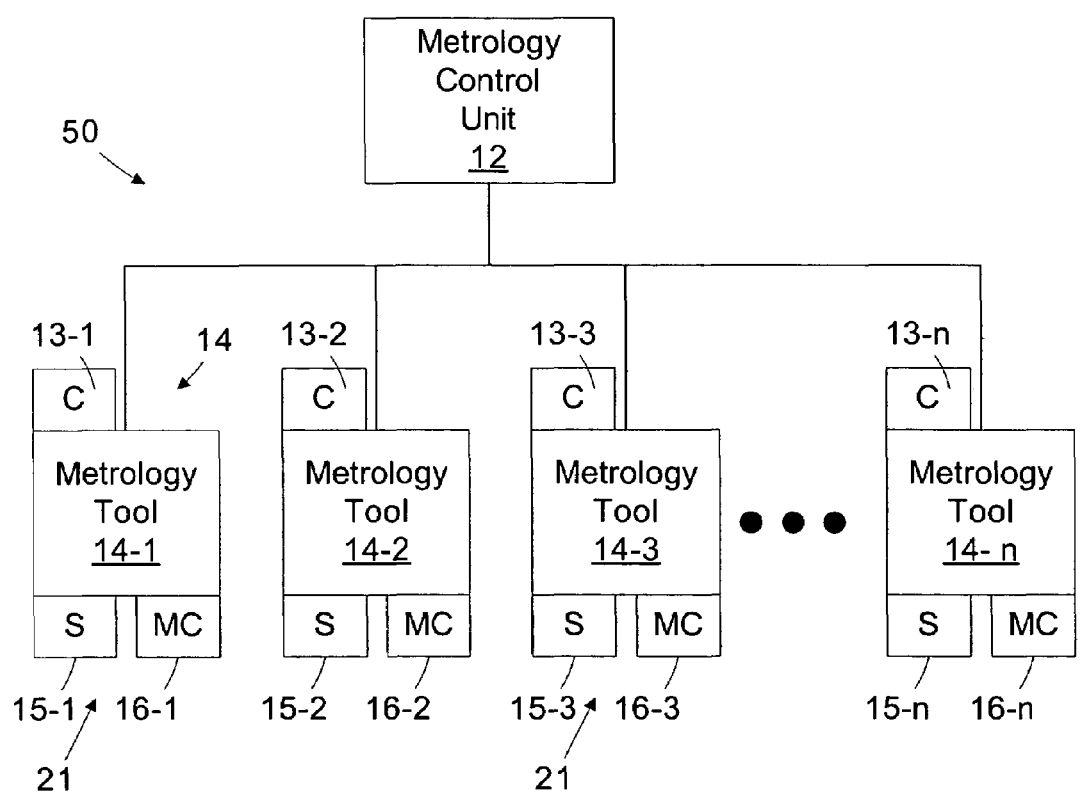
FIG. 2 is a simplified block diagram of a more detailed depiction of a system in accordance with one illustrative embodiment of the present invention.
Figure 3:
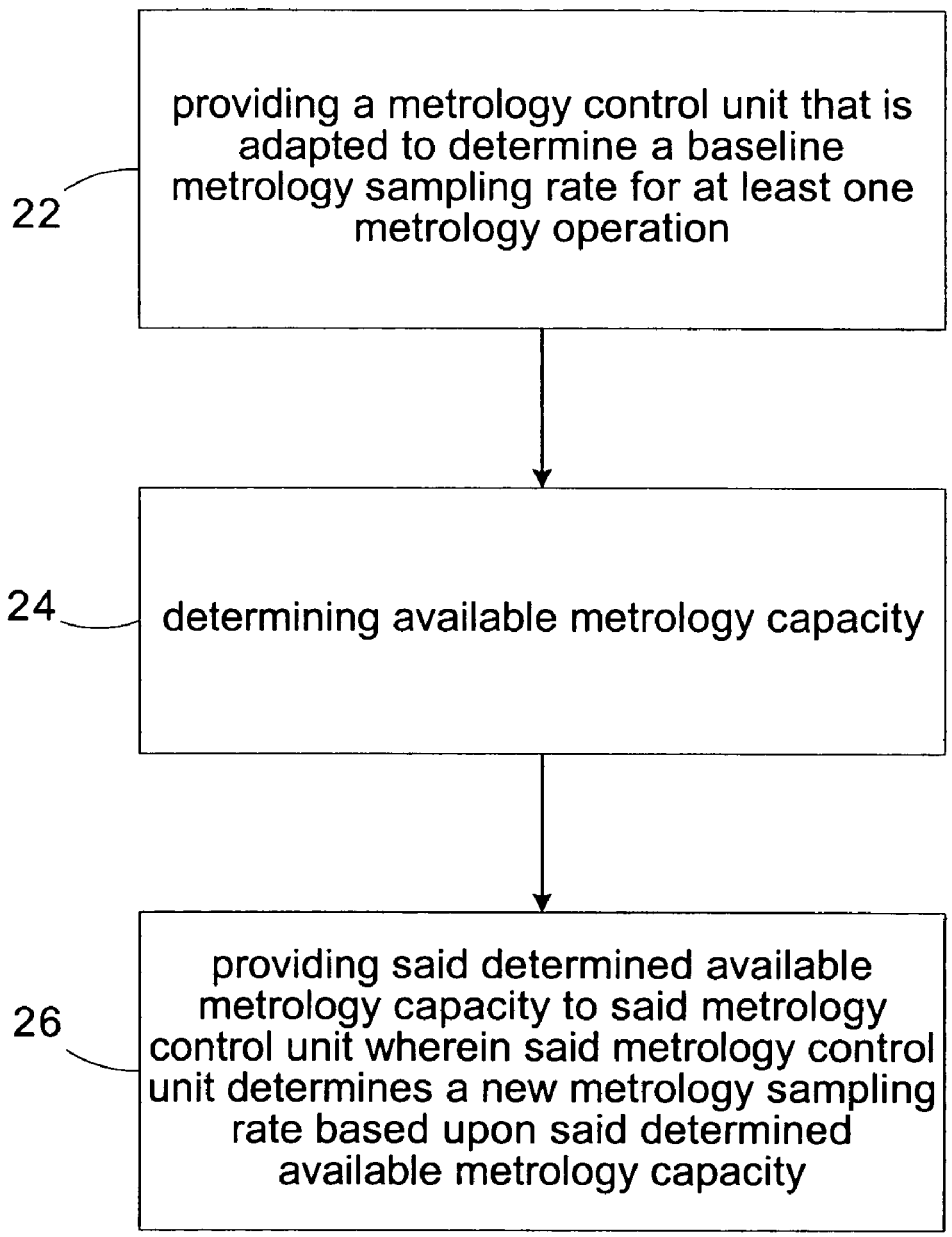
FIG. 3 is a simplified flow diagram of a method of controlling metrology sampling in accordance with one illustrative embodiment of the present invention.

FIG. 2 is a more specific, simplified block diagram of a metrology system 50 in accordance with one illustrative embodiment of the present invention. As shown therein, the metrology control unit 12 is operatively coupled to a plurality of metrology tools 14. In the illustrative embodiment, four such illustrative metrology tools, 14-1, 14-2, 14-3 and 14-n are schematically depicted. However, the present invention may be employed with any such number of metrology tools. The illustrative metrology tools 14 may perform one or more of a variety of metrology operations. For example, the metrology tools 14 may perform metrology operations such as measuring the thickness of a process layer, measuring a critical dimension of a feature, measuring the planarity of a surface, film resistivity, film optical properties (e.g., n and k), defectivity, overlay alignment, etc.

The metrology system 50 may be employed to automatically adjust or control metrology sampling rates based on available metrology tool capacity. In some cases, the metrology tools 14 perform generally the same type of metrology operation, e.g., measuring the thickness of a layer, measuring the critical dimension of a feature, etc. However, the metrology tools 14 are not necessarily completely interchangeable for all metrology operations. For example, if there are two metrology tools 14 and three metrology operations, it is not required that each of the two metrology tools 14 can be used for each of the three metrology operations. The metrology control unit 12 also has the ability to implement some constraints on the resulting sampling rate plans. For example, a constraint may be applied that the sampling rate for a given process operation will not be allowed to fall below a preselected limit, e.g., a minimum sampling rate of 75% may be established for a critical process operation. In semiconductor manufacturing operations, such a constraint may be applied to a very critical process operation, such as a gate etch process operation.

In accordance with one aspect of the present invention, the metrology control unit 12 may employ various control algorithms to control metrology operations performed by the metrology tools 14 within the metrology system 50. In one illustrative embodiment, a first control algorithm is employed wherein all of the metrology tools 14 of a given type are assumed to be completely interchangeable. In that case, when one or more of the metrology tools 14 are not in service (for whatever reason), a new or adjusted metrology sampling rate for each operation may be determined as follows:

$$Rate_{i,new} = Rate_{i,base} \frac{N_{Available}}{N_{Total}} \quad (1)$$

where $Rate_{i,new}$ represents the new metrology sampling rate at operation i, $Rate_{i,base}$ represents the baseline metrology sampling rate at operation i, $N_{Available}$ represents the number of metrology tools 14 currently available, and $N_{Total}$ represents the total number of metrology tools 14 that are normally available to perform metrology operations. Simply put, in this first algorithm, the new sampling rate reflects a reduction in the base metrology sampling rate due to the unavailability of some of the total number of metrology tools 14.

In another illustrative embodiment, a second algorithm may be employed by the metrology system 50. Using the second algorithm, the metrology control unit 12 only considers or counts metrology tools 14 that can be used for a specific metrology operation. For example, the metrology control unit 12 may only consider metrology tools 14 that can perform critical dimension measurements. In this illustrative embodiment, the new or adjusted metrology sampling rate may be determined as follows:

$$Rate_{i,new} = Rate_{i,base} \frac{N_{i,Available}}{N_{i,Total}} \qquad (2)$$

where $Rate_{i,new}$ and $Rate_{i,base}$ are defined as above, $N_{i,Available}$ represents the number of metrology tools 14 currently available for metrology operation i, and $N_{i,Total}$ represents the total number of tools 14 that are normally available for metrology operation i. Note that, the first algorithm (Equation 1) is a subset of the second algorithm (Equation 2) for the special case where all metrology tools 14 are available for all metrology operations.

One benefit of the second algorithm is that it is computationally simple. One potential drawback with respect to the second algorithm is that it does not allow the reduction of metrology sampling rates at operations other than those that are run on the metrology tool 14 that is down. For example, if metrology operation j is not run by a down metrology tool, the second algorithm would not allow the sampling rate at metrology operation j to be reduced in order to free up capacity to run metrology operation i.

In yet another illustrative embodiment, a third control algorithm may be employed by the metrology system 50. Using the third algorithm, the metrology control unit 12 may modify sampling rates at metrology operations other than those that are performed by a metrology tool 14 that has been taken out of service. This methodology allows maintenance of metrology sampling rates that are (on average) relatively close to the baseline metrology sampling rates for all metrology operations when all metrology tools 14 are available. In this methodology, the first step is to generate an aggregate sampling rate. This is the sum of all individual metrology sampling rates across all metrology operations:

$$Rate_{Total} = \sum_{i=1}^{N} Rate_i \qquad (3)$$

where $Rate_{Total}$ is the aggregate rate, N is the total number of metrology operations allowable for metrology tools 14 of that type (e.g., thickness measurement, critical dimension measurement), and $Rate_i$ is the baseline sampling rate at the operation i.

The next step is to scale the $Rate_{Total}$ values according to available metrology tools:

$$Rate_{Available} = Rate_{Total} \frac{N_{Available}}{N_{Total}} \qquad (4)$$

where $Rate_{Total}$ is defined as above, $Rate_{Available}$ is the new available capacity, $N_{Available}$ is the number of available metrology tools 14, and $N_{Total}$ is the total number of metrology tools 14 that could potentially be available for that metrology type. Generally, type refers to a group of metrology tools that can be used to perform the same metrology operations. For example, irrespective of the manufacturer of the metrology tools, if several tools can perform the same metrology operation, e.g., film thickness, then all of those tools would be considered to be of the same type.

The final step is to solve the following equation:

$$\min \sum_{i=1}^{N} (Rate_{i,new} - Rate_{i,base})^2 \qquad (5)$$

subject to the constraint:

$$Rate_{Available} \leq \sum_{i=1}^{N} Rate_{i,new} \qquad (6)$$

In effect, the third algorithm minimize the square of the deviation of the new metrology sampling rates ($Rate_{i,new}$) from the baseline metrology sampling rates ($Rate_{i,base}$) subject to the constraint of available metrology capacity ($Rate_{Available}$). The benefit of this third methodology is that it allows for small reductions in metrology sampling rates across multiple operations to address reductions in metrology capacity. However, solving this third algorithm is much more computationally complex than the other two algorithms discussed above.

It should be noted that, in the above example, the aggregate rate ($Rate_{Total}$) was used as a surrogate for total metrology capacity. This is usually a good estimate if the time to measure a lot of wafers does not vary greatly from one operation to another. In cases where measurement time does vary greatly, a modified equation may be used that incorporates those time differences. As one illustrative example, the modified equation could be:

$$Rate_{Total} = \sum_{i=1}^{N} Time_i * Rate_i \qquad (7)$$

and the constraint would then be:

$$Rate_{Available} \leq \sum_{i=1}^{N} Time_i * Rate_{i,new} \qquad (8)$$

where $Time_i$ represents the cycle time of a lot at operation i and all other variables are defined as above.

The present invention is generally directed to various methods and systems for dynamically adjusting metrology sampling based upon available metrology capacity. In one illustrative embodiment, the method comprises providing a metrology control unit that is adapted to determine a baseline metrology sampling rate for at least one metrology operation, determining available metrology capacity, and providing the determined available metrology capacity to the metrology control unit wherein the metrology control unit determines a new metrology sampling rate based upon the determined available metrology capacity.

In another illustrative embodiment, the method comprises providing a metrology control unit that is adapted to determine a baseline metrology sampling rate for at least one metrology operation, determining available metrology capacity, wherein the step of determining available metrology capacity comprises determining a number of metrology tools that are currently available as compared to a total number of metrology tools that are generally available, wherein all of the metrology tools are assumed to be completely interchangeable, providing the determined available metrology capacity to the metrology control unit, wherein the metrology control unit determines a new metrology sampling rate based upon the determined available metrology capacity, and performing additional metrology operations in accordance with the new metrology sampling rate.

In yet another illustrative embodiment, the method comprises providing a metrology control unit that is adapted to determine a baseline metrology sampling rate for at least one metrology operation, determining available metrology capacity, wherein the step of determining available metrology capacity comprises determining a number of metrology tools that are currently available for performing a specific metrology operation as compared to a total number of metrology tools that are generally available for performing the specific metrology operation, wherein all of the metrology tools are adapted to perform at least the specific metrology operation, providing the determined available metrology capacity to the metrology control unit, wherein the metrology control unit determines a new metrology sampling rate based upon the determined available metrology capacity, and performing additional metrology operations in accordance with the new metrology sampling rate.

In a further illustrative embodiment, the method comprises providing a metrology control unit that is adapted to determine a baseline metrology sampling rate for at least one metrology operation, determining available metrology capacity, wherein the step of determining available metrology capacity comprises determining metrology tools that are available for performing the at least one metrology operation and at least a second metrology operation that is different from the at least one metrology operation, providing the determined available metrology capacity to the metrology control unit, wherein the metrology control unit determines a new metrology sampling rate based upon the determined available metrology capacity, wherein, in determining the new metrology sampling rate, a sampling rate for the second metrology operation is reduced to thereby free up additional metrology capacity for performing the at least one metrology operation, and performing additional metrology operations in accordance with the new metrology sampling rate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    providing a metrology control unit that is adapted to determine a baseline metrology sampling rate for at least one metrology operation;
    determining available metrology capacity; and
    providing said determined available metrology capacity to said metrology control unit wherein said metrology control unit determines a new metrology sampling rate based upon said determined available metrology capacity.

2. The method of claim 1, wherein said metrology control unit is adapted to control a plurality of metrology tools.

3. The method of claim 2, wherein each of said metrology tools are of the same type.

4. The method of claim 1, wherein said at least one metrology operation comprises at least one of measuring a critical dimension, measuring a thickness of a layer, measuring a surface planarity, measuring an electrical characteristic, measuring film resistivity, measuring film optical properties, measuring defectivity, and measuring overlay alignment.

5. The method of claim 1, further comprising performing additional metrology operations in accordance with said new metrology sampling rate.

6. The method of claim 5, wherein the method further comprises, after said additional metrology operations in accordance with said new metrology sampling rate have been performed for a period of time, performing additional metrology operations in accordance with said baseline metrology sampling rate.

7. The method of claim 1, wherein the step of determining available metrology capacity comprises determining a number of metrology tools that are currently available as compared to a total number of metrology tools that are generally available, wherein all of the metrology tools are assumed to be completely interchangeable.

8. The method of claim 1, wherein the step of determining available metrology capacity comprises determining a number of metrology tools that are currently available for performing a specific metrology operation as compared to a total number of metrology tools that are generally available for performing said specific metrology operation, wherein all of the metrology tools are adapted to perform at least said specific metrology operation.

9. The method of claim 1, wherein the step of determining available metrology capacity comprises:
    determining metrology tools that are available for performing said at least one metrology operation and at least a second metrology operation that is different from said at least one metrology operation; and
    in the step of determining the new metrology sampling rate, reducing a sampling rate for said second metrology operation to thereby free up additional metrology capacity for performing said at least one metrology operation.

10. The method of claim 1, wherein said new metrology sampling rate is determined by performing the following calculation:

$$Rate_{i,new} = Rate_{i,base} \frac{N_{Available}}{N_{Total}}$$

where $Rate_{i,new}$ represents a new metrology sampling rate at operation i, $Rate_{i,base}$ represents a baseline metrology sampling rate at operation i, $N_{Available}$ represents a number of metrology tools currently available, and $N_{Total}$ represents a total number of metrology tools that are normally available.

11. The method of claim 1, wherein said new metrology sampling rate is determined by performing the following calculation:

$$Rate_{i,new} = Rate_{i,base} \frac{N_{i,Available}}{N_{i,Total}}$$

where $Rate_{i,new}$ represents a new metrology sampling rate at operation i, and $Rate_{i,base}$ represents a baseline metrology sampling rate at operation i, $N_{i,Available}$ represents a number of metrology tools currently available for operation i, and $N_{i,Total}$ represents a total number of metrology tools that are normally available for operation i.

12. The method of claim 1, wherein said new metrology sampling rate is determined by performing the following steps:

determining an aggregate metrology sampling rate for all metrology operations by using the following equation:

$$Rate_{Total} = \sum_{i=1}^{N} Rate_i$$

where $Rate_{Total}$ is the aggregate metrology sampling rate for all metrology operations, N is the total number of metrology operations allowable for metrology tools of a given type, and $Rate_i$ is a baseline metrology sampling rate at a given operation;

scaling the $Rate_{Total}$ values according to available metrology tools by performing the following calculation:

$$Rate_{Available} = Rate_{Total} \frac{N_{Available}}{N_{Total}}$$

where $Rate_{Total}$ is the aggregate metrology sampling rate for all metrology operations, $Rate_{Available}$ is the new available capacity, $N_{Available}$ is the number of currently available metrology tools, and $N_{Total}$ is the total number of metrology tools that are normally available; and performing the following calculation:

$$\min \sum_{i=1}^{N} (Rate_{i,new} - Rate_{i,base})^2$$

subject to the constraint:

$$Rate_{Available} \leq \sum_{i=1}^{N} Rate_{i,new}.$$

13. A method, comprising:

providing a metrology control unit that is adapted to determine a baseline metrology sampling rate for at least one metrology operation;

determining available metrology capacity, wherein the step of determining available metrology capacity comprises determining a number of metrology tools that are currently available as compared to a total number of metrology tools that are generally available, wherein all of the metrology tools are assumed to be completely interchangeable;

providing said determined available metrology capacity to said metrology control unit wherein said metrology control unit determines a new metrology sampling rate based upon said determined available metrology capacity; and performing additional metrology operations in accordance with said new metrology sampling rate.

14. The method of claim 13, wherein said metrology control unit is adapted to control a plurality of metrology tools.

15. The method of claim 14, wherein each of said metrology tools are of the same type.

16. The method of claim 13, wherein the method further comprises, after said additional metrology operations in accordance with said new metrology sampling rate have been performed for a period of time, performing additional metrology operations in accordance with said baseline metrology sampling rate.

17. The method of claim 13, wherein said new metrology sampling rate is determined by performing the following calculation:

$$Rate_{i,new} = Rate_{i,base} \frac{N_{Available}}{N_{Total}}$$

where $Rate_{i,new}$ represents a new metrology sampling rate at operation i, $Rate_{i,base}$ represents a baseline metrology sampling rate at operation i, $N_{Available}$ represents a number of metrology tools currently available, and $N_{Total}$ represents a total number of metrology tools that are normally available.

18. A method, comprising:

providing a metrology control unit that is adapted to determine a baseline metrology sampling rate for at least one metrology operation;

determining available metrology capacity, wherein the step of determining available metrology capacity comprises determining a number of metrology tools that are currently available for performing a specific metrology operation as compared to a total number of metrology tools that are generally available for performing said specific metrology operation, wherein all of the metrology tools are adapted to perform at least said specific metrology operation;

providing said determined available metrology capacity to said metrology control unit wherein said metrology control unit determines a new metrology sampling rate based upon said determined available metrology capacity; and performing additional metrology operations in accordance with said new metrology sampling rate.

19. The method of claim 18, wherein said metrology control unit is adapted to control a plurality of metrology tools.

20. The method of claim 19, wherein each of said metrology tools are of the same type.

21. The method of claim 18, wherein the method further comprises, after said additional metrology operations in accordance with said new metrology sampling rate have been performed for a period of time, performing additional metrology operations in accordance with said baseline metrology sampling rate.

22. The method of claim 18, wherein said new metrology sampling rate is determined by performing the following calculation:

$$\text{Rate}_{i,new} = \text{Rate}_{i,base} \frac{N_{i,Available}}{N_{i,Total}}$$

where $\text{Rate}_{i,new}$ represents a metrology new sampling rate at operation i, and $\text{Rate}_{i,base}$ represents a baseline metrology sampling rate at operation i, $N_{i,Available}$ represents a number of metrology tools currently available for operation i, and $N_{i,Total}$ represents a total number of metrology tools that are normally available for operation i.

23. A method, comprising:
providing a metrology control unit that is adapted to determine a baseline metrology sampling rate for at least one metrology operation;
determining available metrology capacity, wherein the step of determining available metrology capacity comprises determining metrology tools that are available for performing said at least one metrology operation and at least a second metrology operation that is different from said at least one metrology operation;
providing said determined available metrology capacity to said metrology control unit wherein said metrology control unit determines a new metrology sampling rate based upon said determined available metrology capacity, wherein, in determining the new metrology sampling rate, a sampling rate for said second metrology operation is reduced to thereby free up additional metrology capacity for performing said at least one metrology operation; and
performing additional metrology operations in accordance with said new metrology sampling rate.

24. The method of claim 23, wherein said metrology control unit is adapted to control a plurality of metrology tools.

25. The method of claim 24, wherein each of said metrology tools are of the same type.

26. The method of claim 23, wherein the method further comprises, after said additional metrology operations in accordance with said new metrology sampling rate have been performed for a period of time, performing additional metrology operations in accordance with said baseline metrology sampling rate.

27. The method of claim 23, wherein said new metrology sampling rate is determined by performing the following steps:
determining an aggregate metrology sampling rate for all metrology operations by using the following equation:

$$\text{Rate}_{Total} = \sum_{i=1}^{N} \text{Rate}_i$$

where $\text{Rate}_{Total}$ is the aggregate metrology sampling rate for all metrology operations, N is the total number of metrology operations allowable for metrology tools of a given type, and $\text{Rate}_i$ is a baseline metrology sampling rate at a given operation;
scaling the $\text{Rate}_{Total}$ values according to available metrology tools by performing the following calculation:

$$\text{Rate}_{Available} = \text{Rate}_{Total} \frac{N_{Available}}{N_{Total}}$$

where $\text{Rate}_{Total}$ is the aggregate metrology sampling rate for all metrology operations, $\text{Rate}_{Available}$ is the new available capacity, $N_{Available}$ is the number of currently available metrology tools, and $N_{Total}$ is the total number of metrology tools that are normally available; and
performing the following calculation:

$$\min \sum_{i=1}^{N} (\text{Rate}_{i,new} - \text{Rate}_{i,base})^2$$

subject to the constraint:

$$\text{Rate}_{Available} \leq \sum_{i=1}^{N} \text{Rate}_{i,new}.$$

* * * * *